United States Patent

Bito et al.

Patent Number: 5,572,124
Date of Patent: Nov. 5, 1996

[54] INSPECTION METHOD AND INSPECTION APPARATUS USING NUCLEAR MAGNETIC RESONANCE

[75] Inventors: Yoshitaka Bito; Satoshi Hirata; Takayuki Nabeshima, all of Kokubunji; Etsuji Yamamoto, Akishima, all of Japan

[73] Assignees: Hitachi, Ltd.; Hitachi Medical Corporation, both of Tokyo, Japan

[21] Appl. No.: 361,664

[22] Filed: Dec. 22, 1994

[30] Foreign Application Priority Data

Dec. 27, 1993 [JP] Japan .................................. 5-330878

[51] Int. Cl.⁶ ............................. G01R 33/00; G01V 3/00
[52] U.S. Cl. .......................................... 324/307; 324/309
[58] Field of Search ................................. 324/300, 307, 324/308, 309, 310, 311, 312, 313, 314, 315, 318, 322

[56] References Cited

U.S. PATENT DOCUMENTS

| | | | |
|---|---|---|---|
| 4,719,423 | 1/1988 | Vinegar et al. | 324/307 |
| 4,788,500 | 11/1988 | Patz et al. | 324/306 |
| 4,914,608 | 4/1990 | LeBihan et al. | 324/315 |
| 5,235,279 | 8/1993 | Kaufman et al. | 324/309 |
| 5,278,501 | 1/1994 | Guilfoyle | 324/306 |

FOREIGN PATENT DOCUMENTS

| | | |
|---|---|---|
| 59-90552 | 5/1984 | Japan . |
| 61-13145 | 1/1986 | Japan . |
| 4135538 | 5/1992 | Japan . |
| 4357934 | 12/1992 | Japan . |

OTHER PUBLICATIONS

Radiology, vol. 161, pp. 401–407, 1986.
Magnetic Resonance Medicine 13, 467–477 (1990).
Proceedings of the Society of Magnetic Resonance in Medicine, p. 68, 1993.
Magnetic Resonance in Medicine 1, 370–386 (1984).
Journal of Chemical Physics, vol. 49, 1768–1777 (1968).
Waveform Data Processing for Scientific Measurement, CQ Publication, pp. 181–211 (1986).
The Journal of Chemical Physics, No. 42, pp. 288–292 (1965).

*Primary Examiner*—Michael Tokar
*Attorney, Agent, or Firm*—Antonelli, Terry, Stout & Kraus

[57] ABSTRACT

In an inspection method which generates a static magnetic field, a gradient magnetic field and a radio frequency magnetic field, detects nuclear magnetic resonance signals from an inspection object, computes and processes the nuclear magnetic resonance signals so detected and outputs the result of computation processing, a gradient magnetic field for generating signal attenuation by diffusion and an oscillating gradient magnetic field for generating chemical shift information and spatial information of the materials contained in the inspection object are applied, separation and acquisition of spatial information of each material contained in the inspection object are simultaneously conducted, and a measurement time is shortened.

30 Claims, 6 Drawing Sheets

INSPECTION METHOD AND INSPECTION APPARATUS USING NUCLEAR MAGNETIC RESONANCE

BACKGROUND OF THE INVENTION

This invention relates to an inspection method and an inspection apparatus using nuclear magnetic resonance for measuring a map of diffusion coefficients or a map of signal intensity emphasizing signal attenuation due to diffusion. More particularly, this invention relates to an inspection method and an inspection apparatus which are referred to as "diffusion spectroscopic imaging", separate materials contained in an inspection object in accordance with molecules, and acquire a map of their diffusion coefficients or a map emphasizing signal attenuation due to diffusion.

Various methods of measuring diffusion coefficients of an inspection object or apparent diffusion coefficients of a living body due to perfusion have been proposed in nuclear magnetic resonance inspection apparatuses. The methods which have been employed most widely at present are based on a pulse sequence of Stejskal-Tanner (E. O. Stejskal and J. E. Tanner, The Journal of Chemical Physics, No. 42, pp. 288–292 (1965)).

To measure the diffusion coefficient, etc, this method first excites a nuclear spin by a radio frequency magnetic field and then applies at least two gradient magnetic fields compensating for one another to acquire signals. Here, the term "compensating for one another" means that influences which rotate the phase of the nuclear spin are cancelled if molecules do not move.

In other words, if diffusion exists, the influences of phase rotation cannot be completely cancelled and a signal intensity attenuates at a proportion corresponding to the application amplitude and time of the gradient magnetic field. Therefore, measurement is conducted a plurality of times by changing the application amplitude and time of the gradient magnetic field and the diffusion coefficient can be determined from the attenuation rate of the signal intensity. The gradient magnetic field applied for measuring the diffusion coefficient is referred to as "MPG (Motion Probing Gradient)".

Numeric representation of the influences of the gradient magnetic field on the attenuation rate of the signal intensity is referred to as a "b-factor (gradient factor)".

A method of imaging the diffusion coefficient by extending this method is reported by D. LeBihan et al in Radiology, No. 161, pp. 401–407 (1986). This method combines a gradient magnetic field applied for imaging with an MPG, shoots a plurality of images by changing b-factor and calculates the diffusion coefficient at a given pixel from the attenuation rate of the signal intensity of each image at the corresponding pixel.

As another extension of the method described above, a method of measuring a diffusion coefficient for each molecule (metabolites) contained in a living body, e.g. a diffusion coefficient of N-acetylasparate, adenasine triphosphate, or the like, formed by the molecules (diffusion spectroscopy) is reported by C. T. W. Moonen et al in Magnetic Resonance in Medicine, No. 13, pp. 467–477 (1990). This method separates each molecule by utilizing the difference of a nuclear magnetic resonance frequency, which is slightly change from molecule to molecule, (i.e. chemical shift), conducts measurement a plurality of times by changing the application amplitude of the MPG, and calculates the diffusion coefficient of the molecule from the attenuation rate of the signal intensity of each molecule.

In connection with a method of measuring the map of the diffusion coefficient for each molecule contained in the living body (diffusion spectroscopic imaging), the closest related art is reported by M. Xue et al in Proceedings of the Society of Magnetic Resonance in Medicine, Twelfth Meeting, pp. 68 (1993). This method sets the application amplitude of the MPG to a certain high level and conducts once imaging for each molecule (diffusion weighted spectroscopic imaging). Though not capable of calculating the diffusion coefficient, this method can measure a spectroscopic image of a diffusion emphasis type in which a signal intensity strongly attenuates at a position at which diffusion is vigorous. The method employs 3D-CSI (Chemical Shift Imaging) which has been used most widely at present as the spectroscopic imaging method.

As related references to the present invention relating to spectroscoping imaging, mention can be made of JP-A-59-90552 and JP-A-61-13143. They are the prior art methods which execute high speed spectroscopic imaging. Other prior art references relating to the measurement of the diffusion coefficient include JP-A-4-135538 and JP-A-4-357934.

SUMMARY OF THE INVENTION

According to the prior art technologies described above, it is difficult to separate the materials contained in the object in accordance with the molecules and to measure the map of the diffusion coefficient of each molecule. For, if the method of M. Xue is merely extended, measurement of 3D-CSI must be repeated a plurality of times by changing the MPG. In 3D-CSI, a gradient for acquiring spatial information must be applied the same number of times as the number of pixels in the spatial coordinates by changing the amplitude of the gradient in two directions. Therefore, if the number of pixels in the spatial coordinates is 32×32, the measurement repetition time is one second and the number of times of changing the MPG is 3 times, then, the measurement time of 51 minutes becomes necessary. When a living body is the inspection object, signal accumulation becomes necessary because an S/N (signal-to-noise ratio) is low, and the measurement time becomes extremely long.

It is therefore an object of the present invention to provide an inspection method and an inspection apparatus which solve these problems with the prior art, can separate the materials contained in the inspection object in accordance with the molecules and can measure at a high speed the map of the diffusion coefficient of each molecule so separated or the map of the signal intensity stressing signal attenuation due to diffusion.

In the inspection method according to the present invention, a method of spectroscopic imaging using an oscillating gradient magnetic field is added to a diffusion coefficient measurement method by the MPG.

The spectroscopic imaging method using the oscillating gradients (21, 22 in FIG. 2) is repeated a plurality of times by changing the MPG amplitude (proportional to the height of 21, 22) and the application time (proportional to the width of 21, 22) in order to separate the materials contained in the object in accordance with the molecules, and to calculate the map of the diffusion coefficient of each molecule. Another method comprises conducting the measurement by applying the MPGs (21, 22) at a certain amplitude, and measuring the diffusion emphasis map in which the signal intensity strongly attenuates at portions at which diffusion is vigorous.

As the oscillating gradient (19 in FIG. 2) is applied, chemical shift information and spatial information of the materials contained in the object are simultaneously acquired. To acquire chemical shift information and spatial information, the following methods (1) to (5) can be adapted.

(1) The oscillating gradient (19 in FIG. 2) is applied in a first direction (readout gradient) to simultaneously acquire chemical shift information and spatial information in the first direction. A phase encoding gradient (20) is applied in a second direction (phase encoding gradient) different from the first direction prior to the application of the oscillating gradient. Measurement is repeated by changing the application amplitude of this phase encoding gradient (20) (proportional to the height) or its waveform (rectangular wave, trapezoidal wave, triangular wave, sine wave, etc.) to acquire spatial information in the second direction.

(2) The oscillating gradient (19 in FIG. 5) is applied in the first direction (readout gradient), and the phase encoding gradient (29) is applied in the pulse form in the second direction (phase encoding gradient) different from the first direction simultaneously with the inversion of the polarity of this oscillating gradient (19) so as to simultaneously acquire spatial information in both the first and second directions. Similar measurement is repeated by changing the application timing of the oscillating gradient (19) (by moving the inversion pulse 15 in a direction indicated by arrow) to acquire chemical shift information.

(3) The oscillating gradient (19 in FIG. 5) is applied in the first direction (readout gradient), and the phase encoding gradient (a magnetic field exhibiting a constant continuous value in place of 29 in FIG. 5) during the application of the oscillating gradient (19) is applied in the second direction (phase encoding gradient) different from the first direction to simultaneously acquire spatial information in both the first and second directions. Similar measurement is repeated by changing the application timing of the oscillating gradient (19) (by moving the pulse 15 in the direction indicated by the arrow) to acquire chemical shift information.

(4) First, a direction as the reference (for example, directions of abscissa X and ordinate Y) is determined. A first direction having a first angle ($\theta_1$) with the reference direction (vector extended from the origin) is set as the first direction. The oscillating gradient (29 in FIG. 6) is applied in the first direction to simultaneously acquire chemical shift information and spatial information in the first direction. Next, a direction having a second angle ($\theta_2$) different from the first angle ($\theta_1$) is set as the second direction and the oscillating gradient (30 in FIG. 6) is applied to acquire chemical shift information and spatial information in the second direction. Thereafter, the direction is sequentially changed to the third, fourth, and so forth ($\theta_3$, $\theta_4$, $\theta_5$, $\theta_6$, $\theta_7$, . . . ) and the procedure described above is repeatedly executed to acquire spatial information.

(5) Two oscillating gradients (29, 30 in FIG. 7) having different frequencies are simultaneously applied in mutually different directions to simultaneously acquire chemical shift information and spatial information in the two directions.

Sampling (23) is conducted for acquiring information during the application period of the oscillating gradient (19 in FIG. 11). In this case, asymmetic sampling can be made by making the center time of sampling (23) different from an echo time (time Te/2 to dash line in FIG. 11; generally, the dash line coincides with the center point of AD sampling) with the echo time being the center.

A rectangular wave, a trapezoidal wave or a sine wave is used as the waveform of the oscillating gradient.

The MPG can be regulated in accordance with the static field characteristics or the gradient magnetic field characteristics of the inspection apparatus. Therefore, the application amplitude of the MPG, its application time and its waveform are regulated either partially or wholly, and their values can be preserved. Measurement is carried out by using these preserved values at the time of actual measurement.

According to the present invention, some of chemical shift information and spatial information can be simultaneously acquired by the application of the oscillating gradient. For this reason, spectroscopic imaging when the amplitude of the MPG, etc, is fixed to one value can be executed at a high speed. Unlike the prior art methods, therefore, the measurement time does not become unexecutable even when similar measurement is repeated a plurality of times by changing the amplitude of the MPG, or the like. For example, in the case of the method (1) described above where the oscillating gradient capable of simultaneously acquiring chemical shift information and spatial information in one direction is applied, the measurement time may be about 1.5 minutes when, for example, the number of pixels on the spatial coordinates is 32×32, the measurement repetition time is one second and the number of times of changing the MPG is three times. In the case of the method (2) capable of simultaneously acquiring spatial information in two directions, the measurement time may be about 3 minutes when, for example, the number of pixels in the chemical shift direction is 128, the measurement repetition time is one second and the number of times of changing the MPG is three times. In the case of the method (5) capable of simultaneously acquiring three kinds of information, measurement can be made within a shorter time.

When the application time of the MPG is long or when measurement is conducted with a short echo time, measurement by symmetric sampling with the echo time being the center cannot be made time-wise due to the existence of the MPG. At this time, asymmetric sampling with the echo time being the center can be employed. If the sampling time and the application time of the oscillating gradient are extended to the rear side by using asymmetric sampling, chemical shift resolution as well as spatial resolution can be improved.

A rectangular wave is used as the waveform of the oscillating gradient so as to facilitate subsequent data processing. To mitigate the rise and the fall of the gradient, a trapezoidal wave or a sine wave is used, and this method is effective when the rise and the fall are limited by the characteristics of the inspection apparatus.

The adjustment time during measurement can be reduced by regulating and preserving in advance the application amplitude of the MPG, its application time and its waveform and executing measurement by using these preserved values.

Particularly when measurement is repeated a plurality of times by changing the MPG in order to determine the diffusion coefficient, the reduction of the regulation time is effective.

In the present invention, after the nuclear magnetic resonance phenomenon is induced by the excitation pulse, the MPG is applied to detect signal attenuation due to diffusion. Thereafter, separation of each material (molecule) contained in the object and acquisition of spatial information are simultaneously carried out by using the oscillating gradient. As a result, because separation of each material (molecule) contained in the object and acquisition of spatial information can be simultaneously made by the oscillating gradient, the measurement time can be shortened.

In other words, the present invention can accomplish an inspection method and an inspection apparatus using nuclear magnetic resonance which can separate the materials contained in the object in accordance with the molecules and can measure at a high speed the map of the diffusion coefficient of each molecule or the map of the emphasizing signal attenuation due to diffusion.

DESCRIPTION OF THE PREFERRED EMBODIMENTS

Hereinafter, some preferred embodiments of the present invention will be explained with reference to the accompanying drawings.

Figure 1:
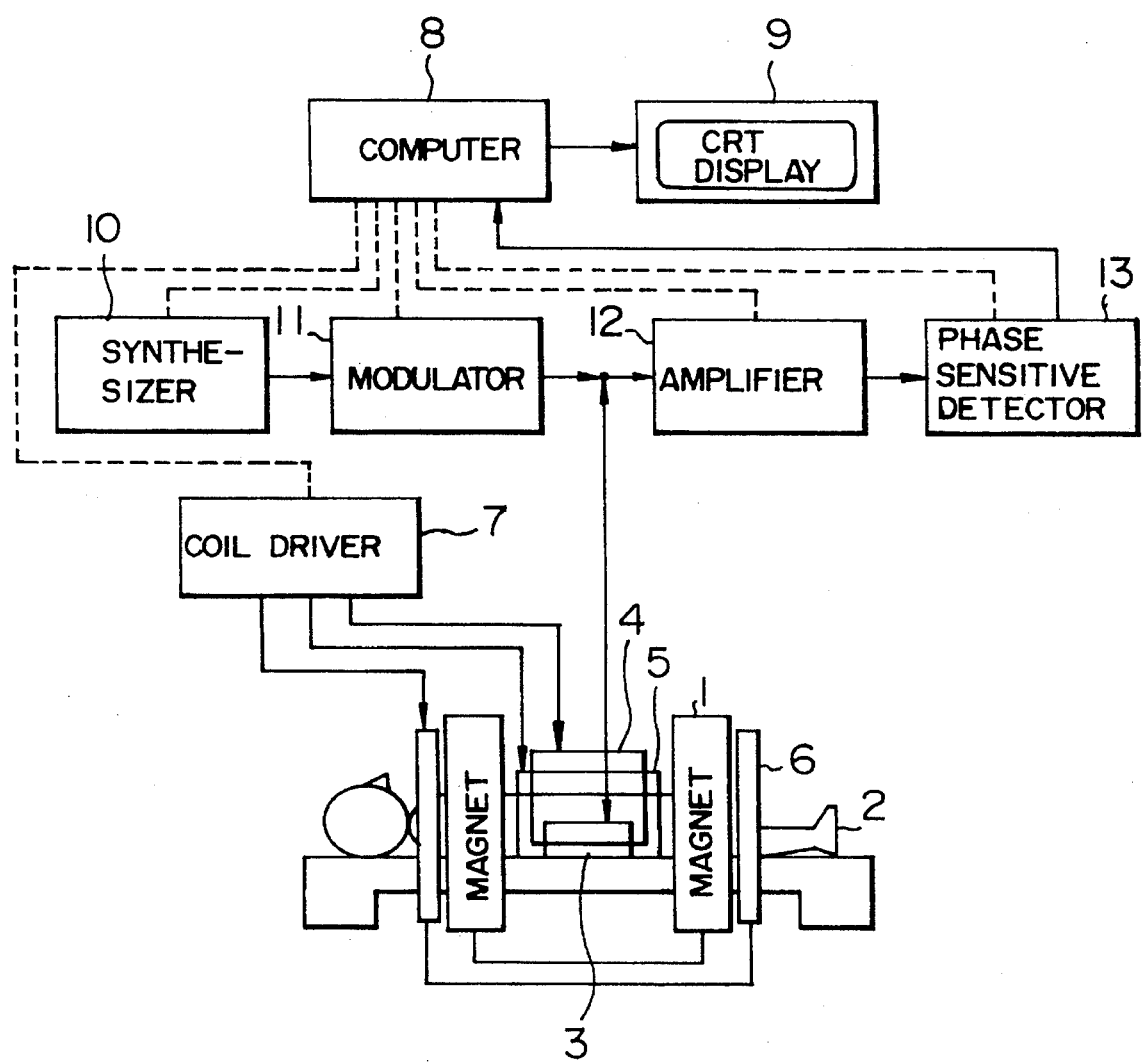
FIG. 1 is a structural view of an inspection apparatus using nuclear magnetic resonance according to the present invention.

FIG. 1 is a schematic structural block diagram of an inspection apparatus using nuclear magnetic resonance (hereinafter merely referred to as the "inspection apparatus") to which the present invention is applied.

Referring to FIG. 1, reference numeral 1 denotes a magnet for generating a static magnetic field $H_o$, 2 is an object for inspection, 3 is a coil for RF transmission and signal reception, and 4, 5 and 6 are gradient coils for generating gradient magnetic fields in X, Y and Z directions, respectively. Reference numeral 7 denotes a coil driver for supplying a current to each of the gradient coils 4, 5 and 6 Reference numeral 8 is a computer for computing measured data and 9 is a CRT display for displaying the computation result by the computer 8.

Next, the outline of the operation of the inspection apparatus shown in FIG. 1 will be explained.

An RF (radio frequency) magnetic field $H_1$ for exciting a nuclear spin of the object 2 is generated by wave-shaping an RF wave generated by a synthesizer 10 by a modulator 11, power-amplifying the wave and supplying a current to the coil 3. The gradient coils 4, 5, 6 receiving the supply of the current from the coil driver 7 generate gradient magnetic fields and modulate signals from the object. The modulation signals are received by the coil 3, amplified by an amplifier 12, detected by a phase sensitive detector 13 and inputted to the computer 8. The computer 8 computes the modulation signals so inputted, and lets the CRT display 9 display the computation result. Incidentally, the computer 8 conducts control so that each device operates at a timing and an amplitude that are in advance programmed.

Among the programs, those which describe the timing and the amplitude of the RF magnetic field, the gradient magnetic fields and signal reception are particularly referred to as a "pulse sequence".

(First Embodiment)

Figure 2:
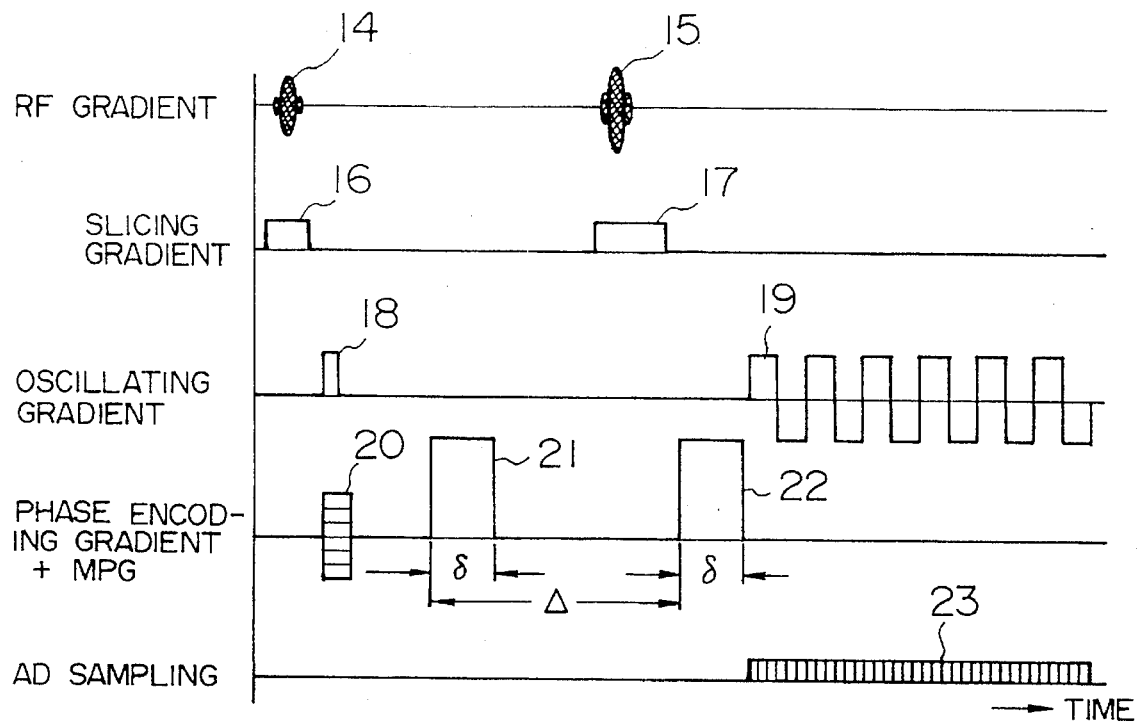
FIG. 2 is a pulse sequence chart in the first embodiment of the present invention.

FIG. 2 is a pulse sequence chart of the magnetic fields according to the first embodiment of the present invention.

An excitation pulse 14 is applied with the application of a slicing gradient 16 so as to induce a nuclear magnetic resonance phenomenon inside a certain slice in the object. A π/2 pulse is typically employed as the excitation pulse 14. A phase encoding gradient 20 is then applied so as to add position information in an encoding direction to the phase of the nuclear spin. Measurement is repeated a plurality of times while the amplitude of the phase encoding gradient 20 is changed in accordance with the program. A dephase gradient 18 for once dephasing the phase of the nuclear spin is applied for a predetermined period lest any miscentering occurs in the echo peak due to the application of the oscillating gradient 19. Next, a slicing gradient 17 is applied and at the same time, an inversion pulse 15 is applied, so that magnetization inside the slice is inversed. A π-pulse is typically employed as the inversion pulse 15. A plurality of echos are generated by applying an oscillating gradient 19.

The application amplitude $G_r$ [T/m] of the oscillating gradient 19 is determined by the following equation in accordance with spatial resolution $\Delta r$ [m] in a readout direction:

$$G_r = 2\pi/(\gamma \cdot \Delta r \cdot N_r \cdot \Delta t) \tag{1}$$

Here, $\gamma$ is a gyromagnetic ratio [Hz/T], $N_r$ is the number of AD samplings per half period and $\Delta t$ is a sampling rate [s]. The cycle time T [s] of the oscillating gradient is determined by the following equation (2) in accordance with a spectral bandwidth of a chemical shift:

$$T = 1/L_\alpha \tag{2}$$

Incidentally, since the application amplitude and period of the oscillating gradient 19 are limited by the slew rate of the gradient coils 4, 5, 6 and coil driver 7, spatial resolution and the chemical shift spectral bandwidth are limited to certain extents. The echos so generated are stored as data by AD sampling 23. Two MPGs 21 and 22, which compensate for each other, are applied between the excitation pulse 14 and the inversion pulse 15 and between the inversion pulse 15 and sampling 23. These two MPGs are regulated so that their time integration of amplitude becomes equal to each other. In this instance, the phase of the nuclear spin is completely rephased if diffusion motion does not exist, and the signal intensity does not attenuate. If any diffusion motion exists, however, the phase cannot be completely rephased, so that the signal intensity attenuates at a ratio corresponding to vigorousness of diffusion motion. A series of measurements when the application amplitude of the MPGs 21, 22 is fixed to one value are completed. Next, similar measurements are repeated a plurality of times by changing the application amplitude of the MPGs 21, 22. A diffusion coefficient can be calculated when the number of times of repetition is at least two, but the number of times of repetition is increased when measurement accuracy is desired to be improved.

Incidentally, the shape of the oscillating gradient is a rectangular wave in FIG. 2, but the shape is not necessarily limited to the rectangular wave, and a trapezoidal wave or a sine wave may be used, as well. Both the trapezoidal wave and sine wave can mitigate the rise and fall of the gradients, and are effective particularly when the rise and fall are limited depending on the characteristics of the apparatus. Further, the MPGs 21 and 22 need not have the same waveform so long as their time integration is equal to each other.

For this reason, an eddy current generated by switching of the gradients can be reduced and measurement accuracy can be improved by reducing the application amplitude of the MPG 21, which has a relatively long time margin, and extending the application time. The sequence of the MPGs 21, 22 and the phase encoding gradient 20 can be reverse to that of FIG. 2. At this time, the time $\Delta$ in FIG. 2 can be extended. By so doing, b-factor which will be explained in the later-appearing data processing can be increased.

Most ideally, complete dephasing (separation) and rephasing (return) are effected by the MPGs 21, 22, but it is difficult in practice to attain complete rephasing due to the characteristics of the apparatus such as wave distortion of the gradients and due to the magnetic field generated by the eddy current. Therefore, the data prepared by adjusting in advance the application time and the application amplitude of the MPGs 21, 22 is preserved as a table, and this table may be looked up at the time of measurement.

Figure 3:
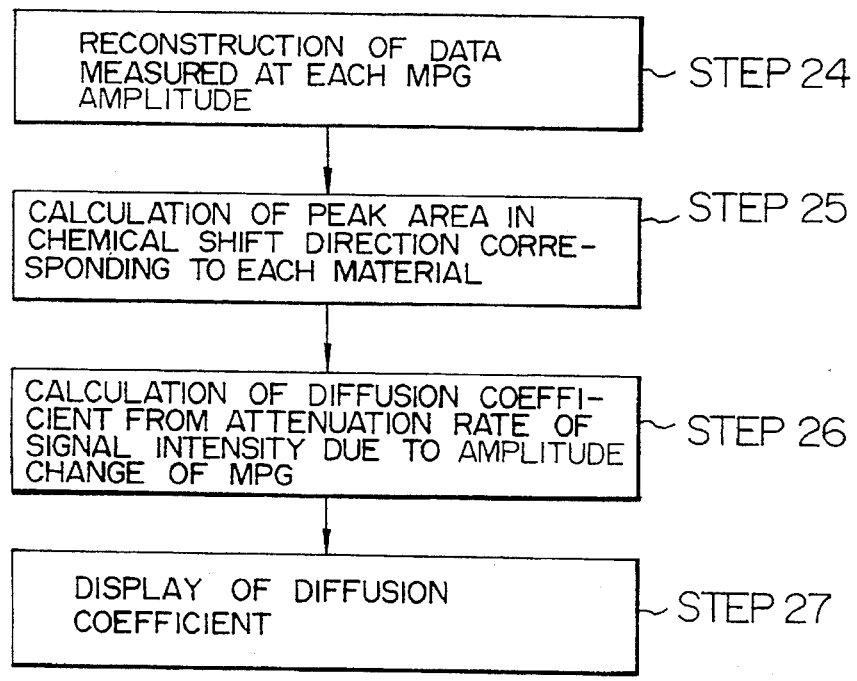
FIG. 3 is a schematic flowchart showing the flow of data processing of a diffusion coefficient in an embodiment of the present invention.

FIG. 3 shows a rough processing flowchart of data processing for determining a diffusion coefficient.

First, at STEP 24, image reconstruction is effected for spectroscopic image data measured at each MPG amplitude.

As a result, the spectroscopic image corresponding to each MPG amplitude can be obtained.

Next, at STEP 25, the peak in the chemical shift direction corresponding to each material (molecule) contained in the object is separated and a signal quantity of each material is calculated. The diffusion coefficient is calculated from the attenuation rate of signals due to the change of the MPG amplitude at STEP 26. Finally, at STEP 27, the diffusion coefficient so calculated is displayed.

Hereinafter, each STEP will be explained in further detail.

STEP 24 will be first explained.

Let's consider the measurement data obtained by fixing the MPG amplitude G [T/m] to one value. It will be assumed that the product of the amplitude of the gradient in the readout direction and the application time is $k_r$, the product of the amplitude of the gradient in the encoding direction and the application time is $k_e$ and the difference between the sampling time and the center time Te of the echo is t. At this time, the sampling points acquired by the sequence shown in FIG. 2 are arranged zigzag in a three-dimensional space (t, $k_r$, $k_e$).

At this time, the number of points in the $k_r$ direction is the number of sampling points $N_r$ per half period of the oscillating gradient and the number of points in the $k_e$ direction is the number of times of repetition Ne of the encoding gradient. The sampling points are grouped for the same ($k_r$, $k_e$). In each group, data are sequentially numbered from smaller values of t, and called "n". At this time, the number of n is equal to $N_n$ which is twice the number of times of oscillation of the oscillating gradient. Numbering is also made for $k_r$ and $k_e$ from smaller values.

The data $F_G(n, k_r, k_e)$ re-arranged in this way are subjected to three-dimensional inverse Fourier transform for n, $k_r$ and $k_e$. As a result, there is obtained a spectroscopic image $I_G(\sigma, r, e)$ on the three-dimensional space expressed by the chemical shift $\sigma$, the position r in the readout direction and the position e in the encoding direction. Here, the term "chemical shift" means the phenomenon that local magnetization changes depending on the kind of molecules even in the same nucleid and a magnetic resonance frequency slightly changes. The chemical shift is intrinsic to the kind of molecules and the kind of molecules can be discriminated using this chemical shift. The following equation (3) is used as the three-dimensional inverse Fourier transform, for example:

$$I_G(\sigma,r,e) = \sum_{n=1}^{N_n} \sum_{k_r=1}^{N_r} \sum_{k_e=1}^{N_e} F_G(n,k_r,k_e) \cdot \exp\left(2\pi i \cdot \left(\frac{n \cdot \sigma}{N_n} + \frac{k_r \cdot r}{N_r} + \frac{k_e \cdot e}{N_e}\right)\right) \quad (3)$$

where i denotes an imaginary-unit. Incidentally, the image reconstruction method is not particularly limited to the method described above. For example, three-dimensional inverse Fourier transform can be carried out after correction such a linear interpolation of zigzag data onto a lattice is added. When the shape of the oscillating gradient is the sine wave in the sequence shown in FIG. 2, the sampling points are arranged in the sine wave shape. At this time, three-dimensional inverse Fourier transform can be executed after correction such as linear interpolation of the data trajectory of the sine wave onto the lattice is added. The processing described above is conducted for all the MPG amplitudes and series of the spectroscopic images can be obtained.

Next, STEP 25 will be explained.

Let's consider the spectroscopic image $I_G(\sigma, r, e)$ when the MPG amplitude G is fixed to one value. The area of the peak corresponding to each material is calculated for each (r, e) on the chemical shift $\sigma$. One of the methods of calculating the area adds all the signals of the frequency band corresponding to each material, for example. To calculate further precisely the area, the area of each peak is calculated by effecting separation of overlapped spectra. The detail of the separation method of the overlapped spectra is described, for example, in "Waveform Data Processing for Scientific Measurement" edited by Shigeo Minami, CQ Publication (1986), pp. 181–211. As a result, the spectroscopic image is converted to $I_G(m, r, e)$. Though the numbers of r and e do not change, the number of m becomes equal to the number of peaks so calculated. In other words, it is equal to the number of materials (molecules) to be measured.

There is often the case where the peak corresponding to each material slightly shifts depending on the position due to the influences of inhomogeneity of the static magnetic field. Therefore, it is advisable to correct such inhomogeneity of the static magnetic field before the area of the peaks is calculated. The processing described above is executed for all the MPG amplitudes and a series of spectroscopic images can be obtained.

STEP 26 will be explained.

First, b-factor [s/m$^2$] corresponding to each MPG amplitude G is calculated in accordance with the following equation (4):

$$b = \gamma^2 G^2 \delta^2 \{\Delta - (\delta/3)\} \quad (4)$$

where $\gamma$ is a gyromagnetic ratio [Hz/T] and $\Delta$ and $\delta$ are the time [s] shown in FIG. 2.

When the signal intensity of the corresponding pixel (m, r, e) of the spectroscopic image $I_G(m, r, e)$ for each MPG amplitude G is S(b), then, the signal attenuation can be described as the following equation (5):

$$S(b)=S(0)\cdot\exp(-D\cdot b) \quad (5)$$

where D is the diffusion coefficient [mz/$^2$] and b is the b-factor when the MPG amplitude is G.

Curve fitting to the equation (5) is made and the diffusion coefficient is calculated. This calculation is conducted for all the pixels (n, r, e), and the diffusion coefficient D(m, r, e) for each material m and at each position r, e is determined.

Figure 4:
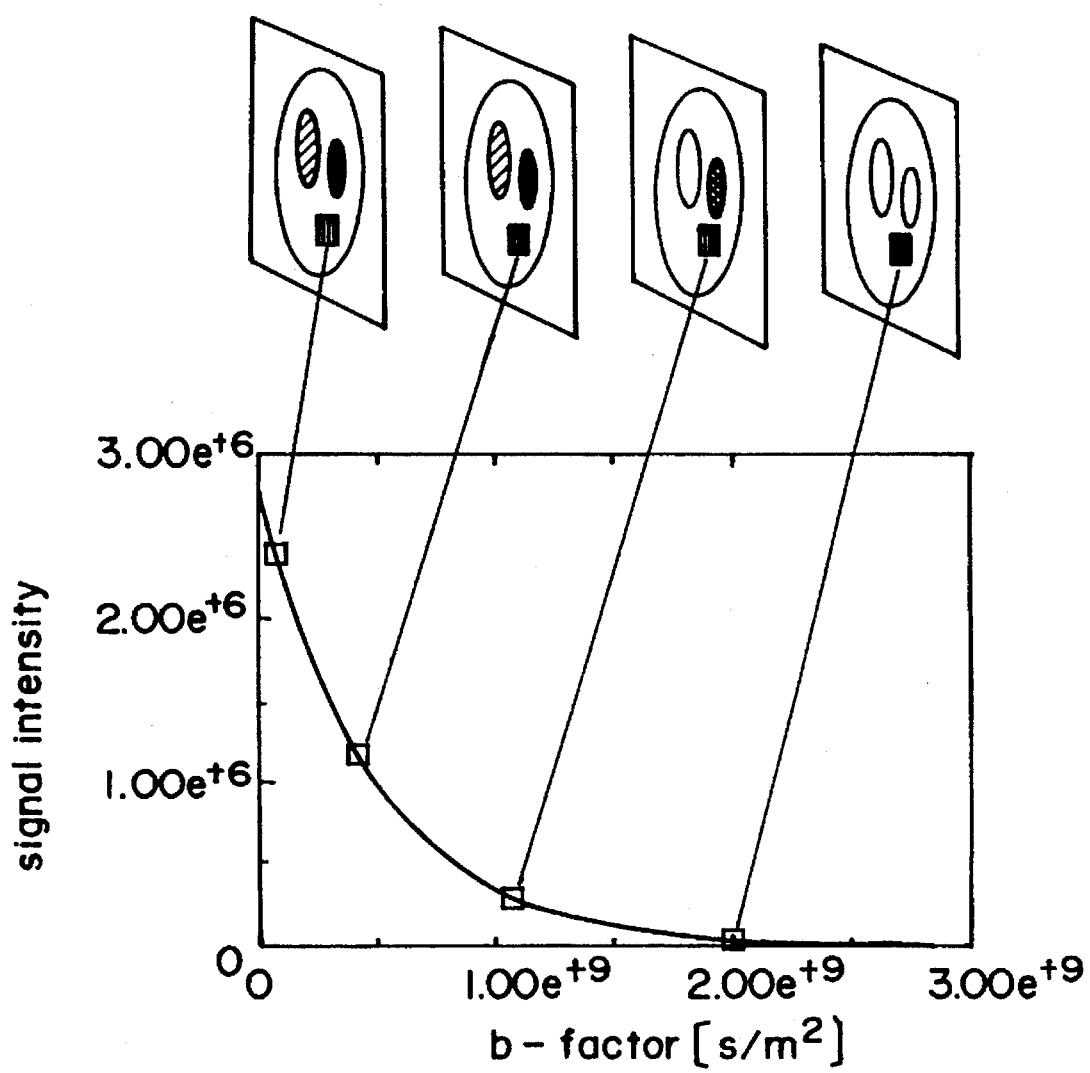
FIG. 4 is a schematic view showing the procedure for calculating the diffusion coefficient in the present invention.

FIG. 4 is a schematic view for explaining the procedure of calculating the diffusion coefficient.

Figure 5:
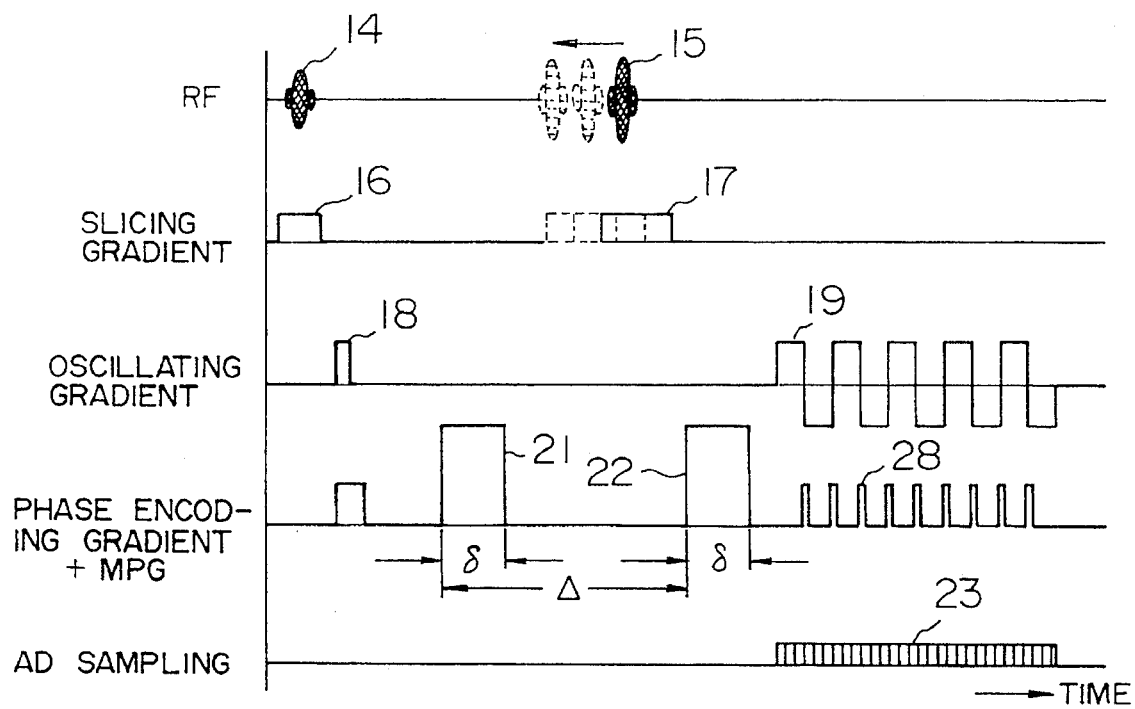
FIG. 5 is a pulse sequence chart in the second embodiment of the present invention.

The drawing at an upper part of FIG. 5 depicts the spectroscopic images arranged in the order of smaller b-factors. In the graph at a lower part of FIG. 5, the b-factor is plotted on the abscissa and the signal intensity, on the ordinate, for a certain pixel. This graph shows the mode of curve fitting to the equation (5).

STEP 27 will be explained.

This STEP may merely conduct display. However, it is convenient to set the background not having any meaning to 0 so as to make the data more comprehensible. This can be accomplished by the following procedure. First, a certain threshold is set, and a pixel (m, r, e) at which the value of the spectroscopic image $I_G$(m, r, e) is below this threshold is determined. The value D(m, r, e) corresponding to this pixel (m, r, e) is set to 0.

(Second Embodiment)

Next, the second embodiment of the present invention will be explained.

FIG. 5 shows a pulse sequence chart in the second embodiment of the present invention.

The excitation pulse 14 is applied with the application of the slicing gradient 16 so as to induce the nuclear magnetic resonance phenomenon in a certain slice inside the object. A π/2-pulse is typically employed as the excitation pulse 14. The dephase gradient 18 for dephasing the nuclear spin phase is once applied for a predetermined time lest miscentering occurs in the echo peak due to the application of the oscillating gradient 19.

Next, magnetization inside the slice is inversed by applying the inversion pulse 15 with the application of the slicing gradient 17. A π-pulse is typically employed as the inversion gradient 15. Then, the oscillating gradient 19 is applied so as to generate a plurality of echos.

A blipped phase encoding gradient 28 for adding position information in the encoding direction is applied simultaneously with the inversion of the polarity of the oscillating gradient 19.

The resulting echos are stored as data by AD sampling 23. Two MPGs compensating for each other are applied between the excitation pulse 14 and the inversion pulse 15 and between the inversion pulse 15 and sampling 23. The two MPGs 21 and 22 are regulated so that time integration of their amplitudes becomes equal to each other. Next, measurement is carried out repeatedly a plurality of times while the application timings of the inversion pulse 15 and the slicing gradient 17 are changed in accordance with the program as indicated by respective arrows.

The number of times of repetition corresponds to the number of pixels in the chemical shift direction. A series of measurements when the application amplitudes of the MPGs are fixed to one value is completed by the procedure described above. Next, the application amplitudes of the MPGs 21, 22 are changed and similar measurement is repeated a plurality of times. The number of times of repetition may be at least two, but is increased when measurement accuracy is desired to be improved.

Incidentally, the shape of the oscillating gradient 19 is a rectangular wave in FIG. 5, but is not limited thereto. For example, a trapezoidal wave or a sine wave may be used, as well. The shape of the MPGs 21, 22, too, is not limited to the rectangular wave but the trapezoidal wave or the sine wave may be used.

The shape of the encoding gradients 28, 29 is blipped, but a rectangular wave or a trapezoidal wave which takes a constant value in the readout time may be used, as well. In this instance, the influences of the eddy current due to switching of the gradients can be reduced.

The outline of data processing has been explained already with reference to FIG. 3. The detail of data processing changes as follows only in STEP 24.

Let's consider the data when the MPG amplitude G is fixed to one value. It will be assumed that the product of the oscillating gradient 19 and the application time is $k_r$, the product of the phase encoding gradient 29 in the encoding direction and the application time is $k_e$, and the difference between the time from the application timing of the inversion pulse 15 to the sampling point and Te/2 (where Te is the time from the excitation pulse to the center of the echo) is t.

The sampling points acquired by the sequence shown in FIG. 5 are arranged in the three-dimensional space (t, $k_r$, $k_e$). In this case, the number of points of $k_r$ is the number $N_r$ of sampling points per half period of the oscillating gradients 19 and 29, and the number of points of $k_e$ is $N_e$ which is the twice of the number of times of oscillation of the oscillating gradient. The sampling points are grouped for the same ($k_r$, $k_e$), are numbered from smaller values of t are called "n". At this time, the number of n is equal to the number of times of the change of the timing of the inversion gradient. Similarly, numbering is also made for $k_r$ and $k_e$ from the smaller values. Three-dimensional inverse Fourier transform of the data $F_G$(n, $k_r$, $k_e$) rearranged in this way is conducted for n, $k_r$ and $k_e$. As a result, the spectroscopic image $I_G$ (σ, r, e) on the three-dimensional space expressed by the chemical shift σ, the position r in the readout direction and the position e in the encoding direction can be obtained. The equation (3) described above, for example, is used for three-dimensional inverse Fourier transform. However, the image reconstruction method is not limited to the method described above. For example, a step of correcting the data on a lattice and arranging them can be added. When the shape of the oscillating gradient 19 is the sine wave in the sequence shown in FIG. 5, the gaps between the sampling points are expressed by the sine.

At this time, linear interpolation may be conducted so that the sampling points are arranged on a lattice, for example. When the encoding gradient is applied at a predetermined value, the sampling points are arranged zigzag in the $k_e$ direction. Three-dimensional inverse Fourier transform may be executed by effecting this correction. The procedures described above are executed for all the MPG amplitudes and a series of spectroscopic images are obtained.

(Third Embodiment)

Next, the third embodiment of the present invention will be described.

Figure 6:
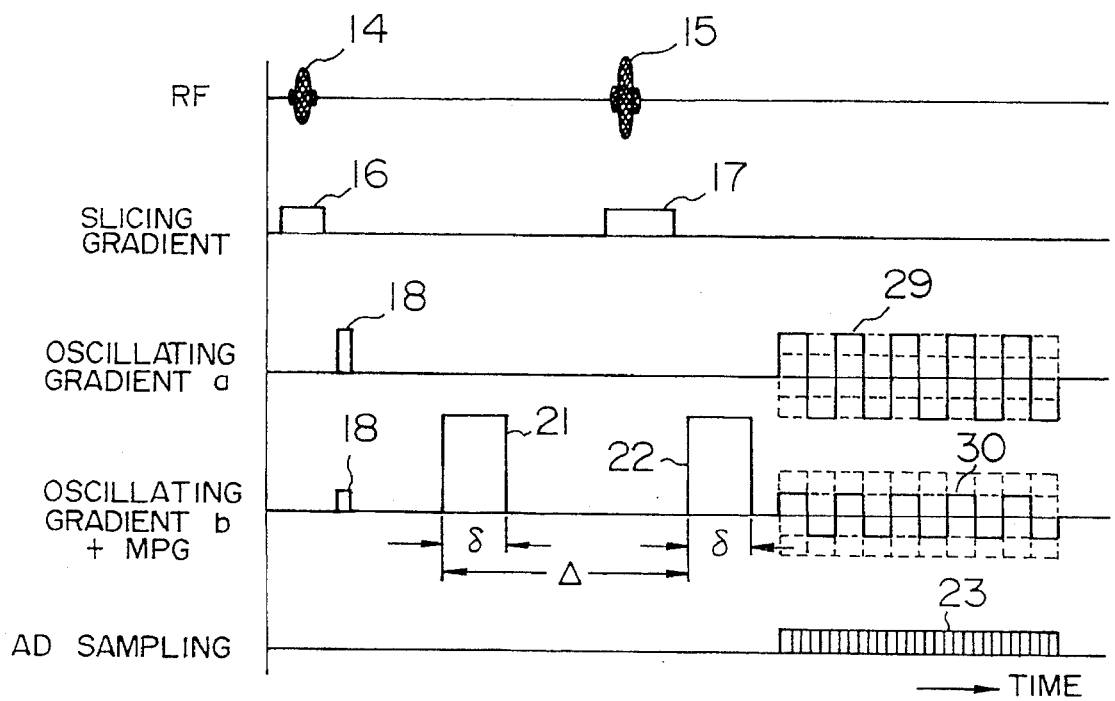
FIG. 6 is a pulse sequence chart in the third embodiment of the present invention.

FIG. 6 is a sequence chart of the third embodiment of the present invention.

The drawing illustrates a sequence comprising the combination of Projection Reconstruction Echo-Planar Hybrid (PREP) with MPG. The outline of the operations other than the oscillating gradients 29 and 30 is the same as the one described above. The operations of the oscillating gradients 29, 30 are as follows.

The application amplitude of the oscillating gradient a (29) is A·cos(θ) and that of the oscillating gradient b (30) is A·sin(θ). Measurement is repeated a plurality of times while changing this θ value. The trajectory of the data so measured becomes radial with respect to ($k_{r1}$, $k_{r2}$) and becomes zigzag with respect to t.

(Fourth Embodiment)

Figure 7:
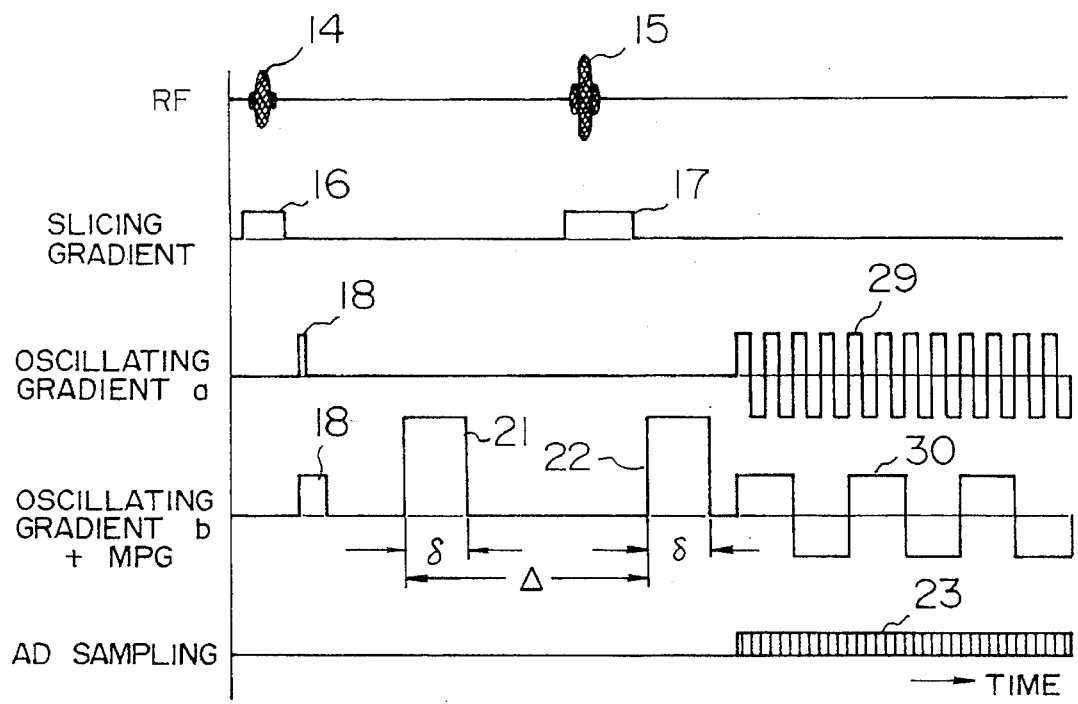
FIG. 7 is a pulse sequence chart in the fourth embodiment of the present invention.

FIG. 7 shows a sequence chart of the fourth embodiment of the present invention.

Here, the drawing shows the sequence comprising the combination of Echo-Planar Shift Mapping (EPSM) with MPG. The outline of the operations other than the oscillating gradients 29, 30 is the same as already described. The operations of the oscillating gradients 29, 30 are as follows.

First, the frequency of the oscillating gradient a (29) is so set as to be different from that of the oscillating gradient b (30). However, the frequency must be decided so that the trajectory of the data can sufficiently scan ($k_{r1}$, $k_{r2}$). Typically, one cycle of either one of the oscillating gradients is so set as to become some multiples of that of the other. The trajectory of the data so measured becomes zigzag at (t, $k_{r1}$, $k_{r2}$).

The flow of data processing is the same as the flow described above. However, as to image reconstruction at STEP 24, it is different depending on the individual pulse sequence. Incidentally, refer to "Magnetic Resonance in Medicine", No. 1, pp. 370–386 (1984) or JP-A-59-90552 for the detail of PREP and EPSM.

Figure 8:
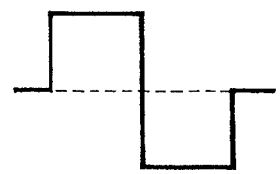
FIG. 8 shows a bipolar waveform used in the present invention.

In the explanation of the foregoing embodiments given above, the application direction of the MPGs 21, 22 is the same as the encoding direction or the direction of the oscillating gradient b, but it can be any direction. Further, these MPGs may be simultaneously applied not only in one direction but also two or three directions. The waveform of the MPGs 21, 22 is not limited to the rectangular wave but can be a bipolar waveform as shown in FIG. 8, for example. When such a bipolar waveform is employed, the velocity component of the object can be removed and the error components resulting from inhomogeneity of the magnetic field can also be removed.

The waveform of the MPGs can be a trapezoidal wave or a sine wave, and the rise and fall of the gradients can be mitigated by using them. Accordingly, such waveforms are effective when the rise and the fall are restricted by the characteristics of the apparatus.

Although the spatial information described above are all two-dimensional information, the present invention holds true of the three-dimensional spatial information, as a well. The three-dimensional spatial information can be obtained by adding a method which applies the encoding gradient in the slicing direction, too, or a method referred to as "multi-slice" to the pulse sequence.

Although the present invention has been described about the pulse sequence of the spin echo system comprising the excitation pulse and the inversion pulse, the present invention is not limited to this method. Examples of other methods will be illustrated as the fifth and sixth embodiments.

(Fifth Embodiment)

Figure 9:
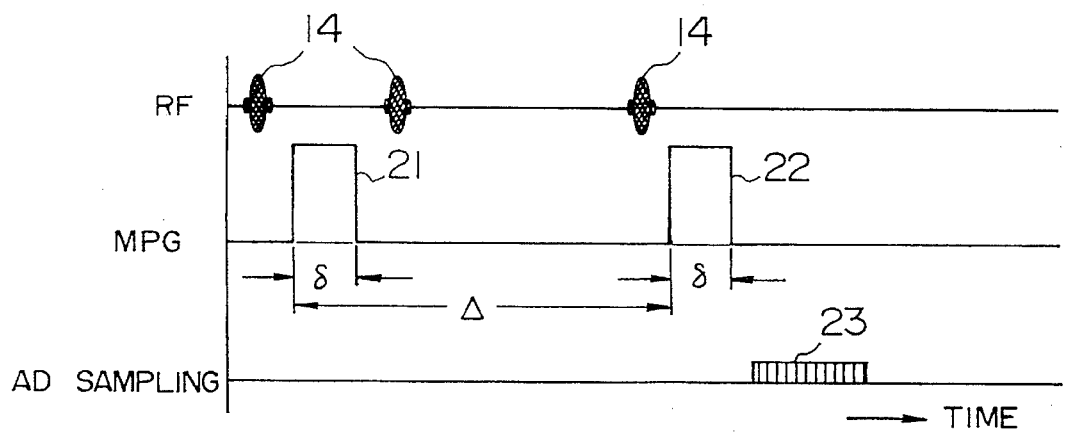
FIG. 9 is a pulse sequence chart of STEAM in the fifth embodiment of the present invention.

FIG. 9 shows a pulse sequence chart of STEAM according to the fifth embodiment of the present invention. When STEAM (stimulated Echo Acquisition Mode) which applies three times the excitation pulse 14 as shown in FIG. 9 is employed, the repetition time Δ of the MPG can be selected relatively easily.

(Sixth Embodiment)

Figure 10:
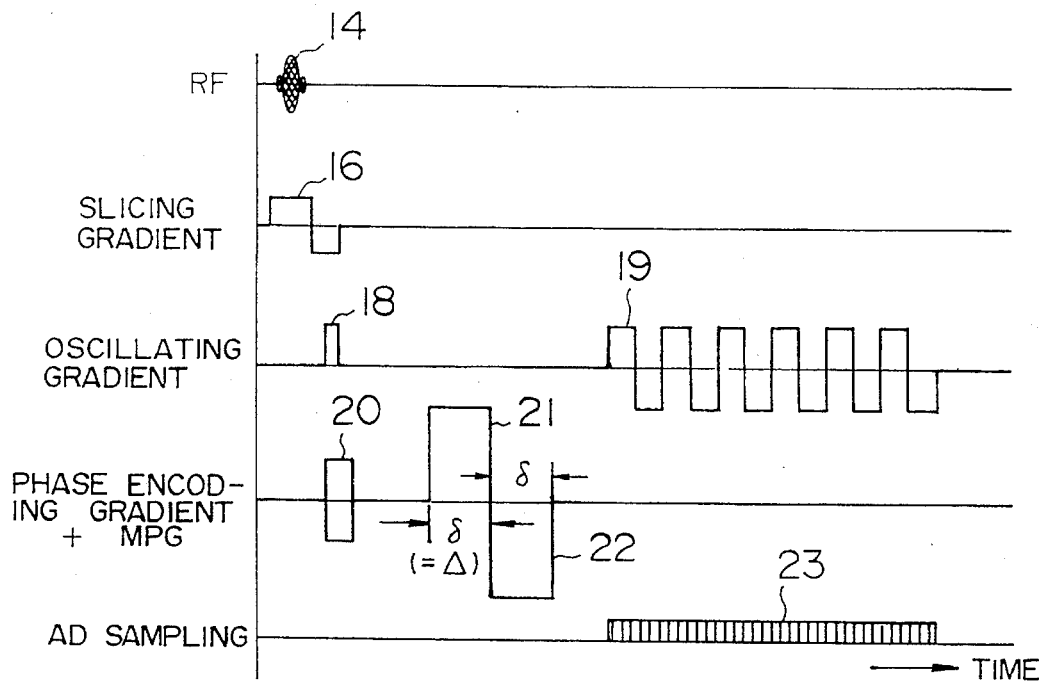
FIG. 10 is a pulse sequence chart in the sixth embodiment of the present invention.

FIG. 10 shows an operation pulse sequence chart according to the sixth embodiment of the present invention. As shown in FIG. 10, only the excitation pulse 14 is applied and the MPGs 21, 22 such as the bipolar waveform are applied. The inversion pulse can be eliminated by so doing. At this time, the echo time can be shortened and the influences of attenuation of the signal intensity due to the transverse relaxation process can be reduced.

FIG. 10 shows a modified example of the sequence of the first embodiment, and a similar method can be likewise applied to the other embodiments.

(Seventh Embodiment)

Figure 11:
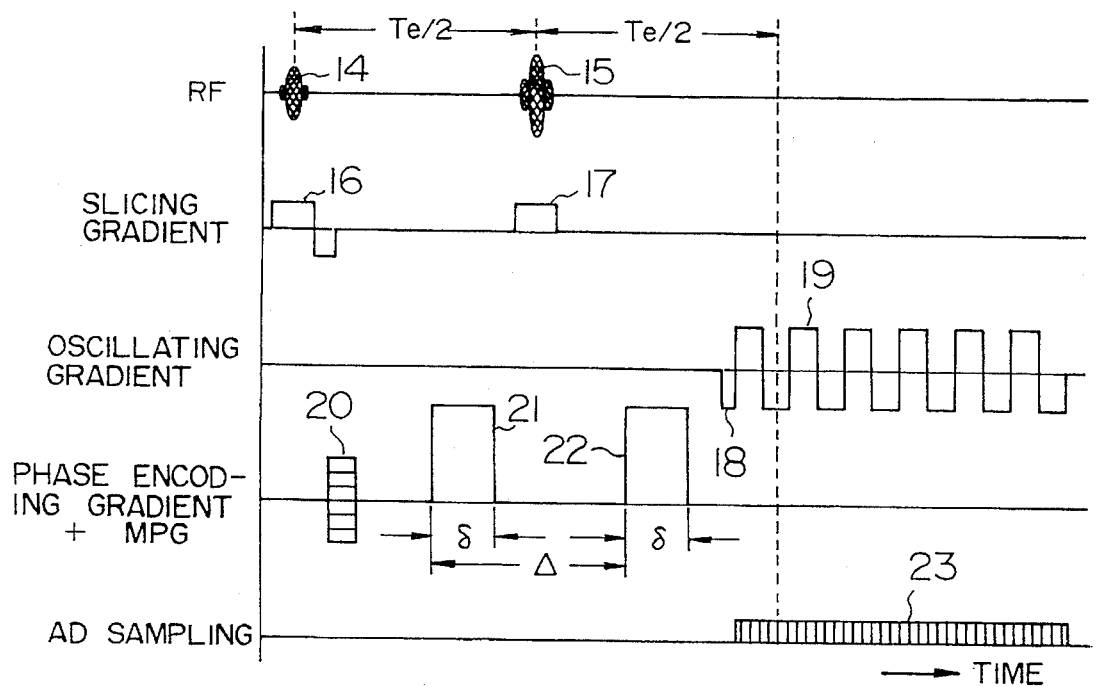
FIG. 11 is a pulse sequence chart of asymmetric sampling in the seventh embodiment of the present invention.

FIG. 11 shows a pulse sequence chart of asymmetric sampling according to the seventh embodiment of the present invention.

Measurement becomes impossible in some cases by symmetric sampling with the echo time Te being the center, due to the MPGs when it is desired to prolong the application time of the MPGs 21, 22 or to conduct measurement with a shorter echo time. In such a case, measurement can be made by using asymmetric sampling with the echo time Te as the center. When asymmetric sampling is employed, the sampling time and the gradient application time can be extended to the rear side, so that chemical shift resolution and spatial resolution can be improved. Half Fourier transform may be employed in data processing in such a manner as to correspond to asymmetric sampling. In FIG. 11, a gradient having an inversed polarity is added to the slicing gradient 16. This is equivalent to the operation which extends the slicing gradient to the rear side in FIG. 2, and is directed to offset any adverse influences of the phase rotation of the nuclear spin due to the slice. However, the influences on the b-factor become smaller and the error to the calculated value of the diffusion coefficient becomes smaller in FIG. 11.

In FIG. 11, the dephase gradient 18 is applied immediately before the oscillating gradient 19. This, too, reduces the influences on the b-factor as well as the error of the diffusion coefficient. Though FIG. 11 shows the application of the method to the pulse sequence for the first embodiment, a similar method can also be applied to the other embodiments.

Further, the present invention can also be applied to measurement of the size of a barrier and permeability in restricted diffusion. For detail of this method, refer to J. E. Tanner and E. O. Stejkal, Journal of Chemical Physics, No. 49, pp. 1768–1777 (1968).

When spectroscopic imaging described above is carried out only once while the MPG amplitude is set to a certain constant value, the diffusion coefficient cannot be calculated but diffusion weighted spectroscopic image, wherein the signal intensity drops at portions having vigorous diffusion, can be made.

We claim:

1. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a motion probing gradient magnetic field for generating signal attenuation by diffusion in order to observe diffusion of materials contained in said inspection object; and applying an oscillating gradient magnetic field so as to acquire simultaneously and separately chemical shift information and spatial information of said materials contained in said inspection object.

2. An inspection method using nuclear magnetic resonance according to claim 1, wherein measurement is carried out repeatedly by changing either partially or wholly an application time, an application amplitude, an application timing and a waveform of said motion probing gradient magnetic field.

3. An inspection method using nuclear magnetic resonance according to claim 1, wherein said oscillating gradient magnetic field is applied in a first direction so as to acquire said chemical shift information and said spatial information in said first direction, a phase encoding gradient magnetic field is applied in a second direction different from said first direction prior to acquisition of said information, and measurement is carried out repeatedly by changing an application amplitude or a waveform of said phase encoding gradient magnetic field so as to acquire said spatial information in said second direction.

4. An inspection method using nuclear magnetic resonance according to claim 1, wherein said oscillating gradient magnetic field is applied in a first direction, a blipped phase encoding gradient magnetic field is applied in a second direction different from said first direction simultaneously with inversion of the polarity of said oscillating gradient magnetic field so as to acquire spatial information in said first and second directions, and said chemical shift information is acquired by changing the application timing of said oscillating gradient magnetic field.

5. An inspection method using nuclear magnetic resonance according to claim 1, wherein said oscillating gradient magnetic field is applied in a first direction, a phase encoding gradient magnetic field is continuously applied at a predetermined amplitude in a second direction different from said first direction during the application of said oscillating gradient magnetic field so as to acquire spatial information in said first and second directions, and said chemical shift information is acquired by changing the application timing of said oscillating gradient magnetic field.

6. An inspection method using nuclear magnetic resonance according to claim 1, further comprising a step of acquiring said chemical shift information and said spatial information in a direction having an angle with a reference direction, the step of acquiring being repeated a plurality of times by applying said oscillating gradient magnetic field in said direction having said angle and by changing said angle so as to acquire said spatial information in directions having a plurality of different angles from said reference direction.

7. An inspection method using nuclear magnetic resonance according to claim 1, wherein said oscillating gradient magnetic field comprises two gradient magnetic fields having different frequencies, and said two gradient magnetic fields are applied in mutually different two directions so as to simultaneously acquire chemical shift information and spatial information in said two directions.

8. An inspection method using nuclear magnetic resonance according to claim 1, further comprising a step of executing sampling of said nuclear magnetic resonance signals for acquiring information during the application time of said oscillating gradient magnetic field, wherein the center time of said sampling is different from an echo time.

9. An inspection method using nuclear magnetic resonance according to claim 1, wherein the shape of said oscillating gradient magnetic field is a rectangular wave, a trapezoidal wave or a sine wave.

10. An inspection method using nuclear magnetic resonance according to claim 1, wherein an application amplitude, an application time and a waveform of said gradient magnetic field for generating signal attenuation by said diffusion are regulated either partially or wholly, regulated values are preserved, and measurement is carried out by using said regulated values.

11. An inspection apparatus using nuclear magnetic resonance, including magnetic field generation means for generating each of a static magnetic field, a gradient magnetic field and a radio frequency magnetic field, signal detection means for detecting nuclear magnetic resonance signals from an inspection object, a computer for computing detection signals of said signal detection means and output means for outputting computation results by said computer, said apparatus comprising:

motion probing gradient magnetic field generation means for generating signal attenuation by diffusion in order to observe diffusion of materials contained in said inspection object; and oscillating gradient magnetic field generation means for acquiring simultaneously and separately chemical shift information and spatial information of said materials contained in said inspection object.

12. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a gradient magnetic field for generating signal attenuation by diffusion in order to observe diffusion of materials contained in said inspection object; and applying an oscillating gradient magnetic field so as to generate chemical shift information and spatial information of said materials contained in said inspection object;

wherein measurement of said nuclear magnetic resonance signals is carried out repeatedly by changing either partially or wholly an application time, an application amplitude, an application timing and a waveform of said gradient magnetic field for generating signal attenuation by diffusions.

13. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a gradient magnetic field for generating signal attenuation by diffusion in order to observe diffusion of materials contained in said inspection object; and applying an oscillating gradient magnetic field so as to generate chemical shift information and spatial information of said materials contained in said inspection object, said oscillating gradient magnetic field being applied in a first direction so as to acquire said chemical shift information and said spatial information in said first direction;

wherein a phase encoding gradient magnetic field is applied in a second direction different from said first direction prior to acquisition of said chemical shift information and said spatial information in said first direction, and measurement of said nuclear magnetic resonance signals is carried out repeatedly by changing an application amplitude or a waveform of said phase encoding gradient magnetic field so as to acquire said spatial information in said second direction.

14. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a motion probing gradient magnetic field for generating signal attenuation by diffusion in order to observe diffusion of materials contained in said inspection object; and applying an oscillating gradient magnetic field so as to generate chemical shift information and spatial information of said materials contained in said inspection object, said oscillating gradient magnetic field being applied in a first direction;

wherein a blipped phase encoding gradient magnetic field is applied in a second direction different from said first direction with inversion of the polarity of said oscillating gradient magnetic field so as to acquire spatial information in said first and second directions, and said chemical shift information is acquired by changing the application timing of said oscillating gradient magnetic field.

15. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a gradient magnetic field for generating signal attenuation by diffusion in order to observe diffusion of materials contained in said inspection object; and applying an oscillating gradient magnetic field so as to generate chemical shift information and spatial information of said materials contained in said inspection object, said oscillating gradient magnetic field being applied in a first direction;

wherein a phase encoding gradient magnetic field is continuously applied at a predetermined amplitude in a second direction different from said first direction during the application of said oscillating gradient magnetic field so as to acquire spatial information n said first and second directions, and said chemical shift information is acquired by changing the application timing of said oscillating gradient magnetic field.

16. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a gradient magnetic field for generating signal attenuation by diffusion in order to observe diffusion of materials contained in said inspection object;

applying an oscillating gradient magnetic field so as to generate chemical shift information and spatial information of said materials contained in said inspection object; and acquiring said chemical shift information and said spatial information in a direction having an angle with a reference direction, said acquiring being repeated a plurality of times by applying said oscillating gradient magnetic field in said direction having said angle and by changing said angle so as to acquire said spatial information in directions having a plurality of different angles from said reference direction.

17. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a motion probing gradient magnetic field for generating signal attenuation by diffusion in order to observe diffusion of materials contained in said inspection object; and applying an oscillating gradient magnetic field so as to generate chemical shift information and spatial information of said materials contained in said inspection object;

wherein said oscillating gradient magnetic field comprises two gradient magnetic fields having different frequencies, and said two gradient magnetic fields are applied in mutually different two directions so as to simultaneously acquire chemical shift information and spatial information in said two directions.

18. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a gradient magnetic field for generating signal attenuation by diffusion in order to observe diffusion of materials contained in said inspection object; and applying an oscillating gradient magnetic field so as to generate chemical shift information and spatial information of said materials contained in said inspection object;

wherein the sampling of said nuclear magnetic resonance signals is executed for acquiring information during the application time of said oscillating gradient magnetic field, and the center time of said sampling is different from an echo time.

19. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a motion probing gradient magnetic field for generating signal attenuation by diffusion in order to observe diffusion of materials contained in said inspection object; and applying an oscillating gradient magnetic field so as to generate chemical shift information and spatial information of said materials contained in said inspection object;

wherein the shape of said oscillating gradient magnetic field is a rectangular wave, a trapezoidal wave or a sine wave.

20. An inspection method using nuclear magnetic resonance by generating a static magnetic field, gradient magnetic fields and a radio frequency magnetic field, detecting nuclear magnetic resonance signals from an inspection object, processing detected nuclear magnetic resonance signals and outputting processing results, said method comprising the steps of:

applying a gradient magnetic field for generating signal attenuation by diffusion in order to observe diffusion of materials contained in said inspection object, wherein an application amplitude, an application time and a waveform of said gradient magnetic field are regulated either partially or wholly, and regulated values are preserved; and applying an oscillating gradient magnetic field so as to generate chemical shift information and spatial information of said materials contained in said inspection object;

wherein measurement of said nuclear magnetic resonance signals is carried out by using said regulated values.

21. An inspection apparatus using nuclear magnetic resonance, said apparatus comprising:

static magnetic field generation means for generating a static magnetic field;

radio frequency magnetic field generation means for generating a radio frequency magnetic field;

signal detection means for detecting nuclear magnetic resonance signals from an inspection object;

motion probing gradient magnetic field generation means for generating signal attenuation by diffusion in order to observe diffusion of materials contained in said inspection object; and oscillating gradient magnetic field generation means for acquiring simultaneously and separately chemical shift information and spatial information of said materials contained in said inspection object.

22. An inspection apparatus using nuclear magnetic resonance according to claim 21, wherein measurement of said nuclear magnetic resonance signals is carried out repeatedly by changing either partially or wholly an application time, an application amplitude, an application timing and the waveform of the motion probing gradient magnetic field.

23. An inspection apparatus using nuclear magnetic resonance according to claim 21, wherein the oscillating gradient magnetic field is applied in a first direction so as to acquire said chemical shift information and said spatial information in said first direction, and wherein a phase encoding gradient magnetic field is applied in a second direction different from said first direction prior to acquisition of said chemical shift information and said spatial information in said first direction, and measurement of said nuclear magnetic resonance signals is carried out repeatedly by changing an application amplitude or a waveform of said phase encoding gradient magnetic field so as to acquire said spatial information in said second direction.

24. An inspection apparatus using nuclear magnetic resonance according to claim 21, wherein the oscillating gradient magnetic field is applied in a first direction, and wherein a blipped phase encoding gradient magnetic field is applied in a second direction different from said first direction simultaneously with inversion of the polarity of said oscillating gradient magnetic field so as to acquire spatial information in said first and second directions, and said chemical shift information is acquired by changing the application timing of said oscillating gradient magnetic field.

25. An inspection apparatus using nuclear magnetic resonance according to claim 21, wherein the oscillating gradient magnetic field is applied in a first direction, and wherein a phase encoding gradient magnetic field is continuously applied at a predetermined amplitude in a second direction different from said first direction during the application of said oscillating gradient magnetic field so as to acquire spatial information in said first and second directions, and said chemical shift information is acquired by changing the application timing of said oscillating gradient magnetic field.

26. An inspection apparatus using nuclear magnetic resonance according to claim 21, further comprising:

acquiring means for acquiring said chemical shift information and said spatial information in a direction having an angle with a reference direction, wherein the acquiring said chemical shift information and said spatial information is repeated a plurality of times by applying the oscillating gradient magnetic field in said direction having said angle and by changing said angle so as to acquire said spatial information in directions having a plurality of different angles from said reference direction.

27. An inspection apparatus using nuclear magnetic resonance according to claim 21, wherein the oscillating gradient magnetic field generation means generates two gradient magnetic fields having different frequencies, and the two gradient magnetic fields are applied in two mutually different directions so as to simultaneously acquire chemical shift information and spatial information in said two directions.

28. An inspection apparatus using nuclear magnetic resonance according to claim 21, wherein said signal detection means samples said nuclear magnetic resonance signals by said signal detection means for acquiring information during the application time of the oscillating gradient magnetic field by said oscillating gradient magnetic field generation means, and the center time of said sampling is different from an echo time.

29. An inspection apparatus using nuclear magnetic resonance according to claim 21, wherein the shape of the oscillating gradient magnetic field is a rectangular wave, a trapezoidal wave or a sine wave.

30. An inspection apparatus using nuclear magnetic resonance according to claim 21, wherein said motion probing gradient magnetic field generation means regulates an application amplitude, an application time and a waveform of the motion probing gradient magnetic field either partially or wholly, and regulated values are preserved, and measurement of said nuclear magnetic resonance signals is carried out by using said regulated values.

* * * * *